(12) United States Patent
Frank

(10) Patent No.: US 11,079,604 B2
(45) Date of Patent: Aug. 3, 2021

(54) DEVICE FOR DETERMINING THE EXPOSURE ENERGY DURING THE EXPOSURE OF AN ELEMENT IN AN OPTICAL SYSTEM, IN PARTICULAR FOR MICROLITHOGRAPHY

(71) Applicant: Carl Zeiss SMT GmbH, Oberkochen (DE)

(72) Inventor: Thomas Frank, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 8 days.

(21) Appl. No.: 16/589,278

(22) Filed: Oct. 1, 2019

(65) Prior Publication Data

US 2020/0103668 A1 Apr. 2, 2020

(30) Foreign Application Priority Data

Oct. 2, 2018 (DE) .......................... 102018124314.6

(51) Int. Cl.
*G02B 27/09* (2006.01)
*G03F 7/20* (2006.01)
*G03F 1/84* (2012.01)

(52) U.S. Cl.
CPC ..... *G02B 27/0961* (2013.01); *G02B 27/0905* (2013.01); *G03F 1/84* (2013.01); *G03F 7/70158* (2013.01)

(58) Field of Classification Search
CPC ... G02B 27/0961; G02B 27/0905; G03F 1/84; G03F 7/70158
USPC ................................................. 356/445–448
See application file for complete search history.

(56) References Cited

U.S. PATENT DOCUMENTS

| 6,665,027 | B1* | 12/2003 | Gunn ................ G02F 1/133526 349/57 |
| 8,396,281 | B2* | 3/2013 | Chang ................ G01N 21/9505 382/149 |
| 9,212,991 | B2* | 12/2015 | Saito ...................... G01N 21/03 |
| 10,168,539 | B2 | 1/2019 | Frank et al. |
| 2001/0024329 | A1 | 9/2001 | Dreistein |

(Continued)

FOREIGN PATENT DOCUMENTS

| CN | 1438545 | 8/2003 | ............... G03F 7/20 |
| DE | 100 59 961 | 7/2001 | ............. G02B 27/14 |

(Continued)

OTHER PUBLICATIONS

German Office Action for German Application No. DE 10 2018 124 314.6 dated May 21, 2019.

(Continued)

*Primary Examiner* — Isiaka O Akanbi
(74) *Attorney, Agent, or Firm* — Fish & Richardson P.C.

(57) ABSTRACT

The invention relates to a device for determining the exposure energy during the exposure of an element in an optical system, in particular for microlithography, comprising an optical element, a diffractive structure which has a locally varying grating period, and an intensity sensor arrangement, wherein electromagnetic radiation diffracted at the diffractive structure during operation of the optical system, in at least one order of diffraction, is directed to the intensity sensor arrangement by way of total internal reflection effected in the optical element.

21 Claims, 10 Drawing Sheets

(56) References Cited

U.S. PATENT DOCUMENTS

| | | | |
|---|---|---|---|
| 2003/0049693 A1* | 3/2003 | Goh | G01N 33/54373 |
| | | | 435/7.9 |
| 2003/0142715 A1 | 7/2003 | Nagai | |
| 2008/0042044 A1* | 2/2008 | Koyama | G01J 1/0414 |
| | | | 250/205 |
| 2010/0215273 A1 | 8/2010 | Aksenov et al. | |
| 2012/0249985 A1* | 10/2012 | Wischmeier | G03F 7/70683 |
| | | | 355/53 |
| 2015/0001408 A1 | 1/2015 | Frank et al. | |
| 2019/0011839 A1 | 1/2019 | Seitz et al. | |

FOREIGN PATENT DOCUMENTS

| | | | |
|---|---|---|---|
| DE | 102011004188 | 8/2011 | G02B 27/10 |
| DE | 102013212613 | 12/2014 | G03F 7/20 |
| DE | 102017115262 | 1/2019 | G03F 1/84 |
| EP | 1 780 770 | 5/2007 | H01I 21/027 |
| JP | S 57-27227 | 2/1982 | G02B 27/10 |
| JP | 2006-259439 | 9/2006 | G02B 5/18 |
| JP | 2007-72026 | 3/2007 | G02B 3/00 |
| JP | 2008-547015 | 12/2008 | G01J 4/04 |
| WO | WO 2018/052505 | 3/2018 | G01M 11/00 |

OTHER PUBLICATIONS

Schreiber et al., "Multi-Aperture Near-to-Eye Display with Lightguide", *Optical Components and Systems*, https://www.iof.fraunhofer.de/content/dam/iof/de/documents/Publikationen/Jahresbericht/2014/mehrkanaliges-near-to-eye-display.pdf, pp. 40-41 (2014).

Notice of Reasons for Rejection issued by the Korean Intellectual Property Office for Korean Application No. KR 10-2019-0116805, dated Feb. 10, 2021 (with English Translation).

The Notice of Final Rejection issued by the Korean Patent Office for Application No. KR 10-2019-0116805, dated Jun. 23, 2021 (with English Translation).

The First Office Action issued by the Chinese Patent Office for Application No. CN 201910908044.7, dated May 12, 2021 (with English Translation).

\* cited by examiner

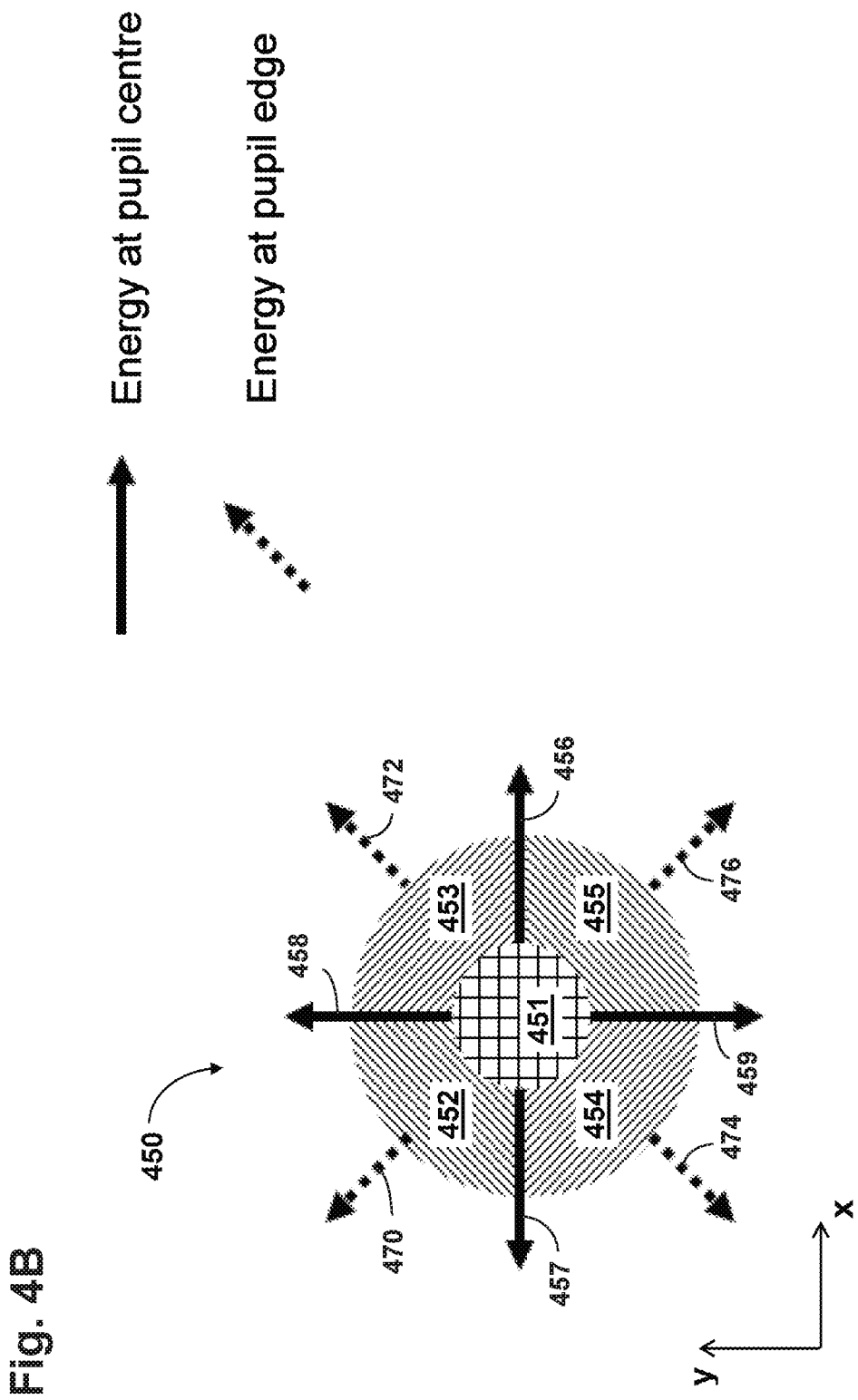

DEVICE FOR DETERMINING THE EXPOSURE ENERGY DURING THE EXPOSURE OF AN ELEMENT IN AN OPTICAL SYSTEM, IN PARTICULAR FOR MICROLITHOGRAPHY

CROSS-REFERENCE TO RELATED APPLICATION

This application claims priority to German Patent Application DE 10 2018 124 314.6, filed on Oct. 2, 2018, the entire content of which is incorporated by reference.

TECHNICAL FIELD

The disclosure relates to a device for determining the exposure energy during the exposure of an element in an optical system, in particular for microlithography. The device is usable, e.g., in a mask inspection apparatus, and also in further microscopy applications and in a microlithographic projection exposure apparatus.

BACKGROUND

Microlithography is used for producing microstructured components, such as for example integrated circuits or liquid crystal displays (LCDs). The microlithography process is carried out in what is called a projection exposure apparatus, which comprises an illumination device and a projection lens. The image of a mask (=reticle) illuminated by use of the illumination device is in this case projected by use of the projection lens onto a substrate (for example a silicon wafer) coated with a light-sensitive layer (photoresist) and arranged in the image plane of the projection lens, in order to transfer the mask structure to the light-sensitive coating of the substrate.

In the lithography process, undesired defects on the mask have a particularly disadvantageous effect since they can be reproduced with every exposure step. A direct analysis of the imaging effect of possible defect positions is thus desirable in order to minimize the mask defects and in order to realize a successful mask repair. Therefore, there is a need to measure or to qualify the mask rapidly and simply, to be precise as far as possible under the same conditions such as are really present in the projection exposure apparatus. For this purpose, it is known, in a mask inspection apparatus, to record and evaluate an aerial image of a segment of the mask. For recording the aerial image, in this case the structures to be measured on the mask are illuminated by an illumination optical unit, wherein the light coming from the mask is projected via an imaging optical unit onto a detector unit and detected.

In order to achieve the highest possible absolute accuracy during the measurement of the structures present on the mask, knowledge of the exposure energy used during the exposure of the mask in the mask exposure apparatus is required. In order to determine said exposure energy, it is known, in particular, in accordance with the schematic basic diagram in FIG. 7, in the mask inspection apparatus, from the beam path leading from a luminous field stop 701 to the measurement object 705 or the mask, to couple out a portion of the electromagnetic radiation with the aid of a beam splitter 703 and to direct it onto an energy or intensity sensor 707. In this case, in accordance with FIG. 7, lens elements 702, 704 and 706 are further situated in the optical beam path, wherein the lens element 704 forms a condenser that is movable along the optical system axis OA.

One problem that occurs in practice during the above-described determination of the exposure energy is that the measurement results obtained can deviate from the actual exposure energy or be corrupted in relation thereto by virtue of the fact that between the beam splitter 703 used for coupling out light and the measurement object 705, the electromagnetic radiation is additionally influenced by optical elements possibly present (e.g., by diffraction effects) and/or the atmosphere present in the respective optical system. The realization of the energy measurement at the smallest possible distance from the measurement object or the mask, which realization is desirable, in principle, against this background, is made more difficult, however, by the fact that the structural space available for the respective optical components in this region is limited to a relatively great extent on account of the small distance between the last condenser lens element and the mask (which may be e.g., just a few millimeters).

SUMMARY

In a general aspect, the present invention provides a device for determining the exposure energy during the exposure of an element in an optical system which enables the exposure energy to be determined as accurately as possible whilst avoiding the problems described above. A device according to the invention for determining the exposure energy during the exposure of an element in an optical system comprises:
an optical element,
a diffractive structure which has a locally varying grating period, and
an intensity sensor arrangement,
wherein electromagnetic radiation diffracted at the diffractive structure during operation of the optical system, in at least one order of diffraction, is directed to the intensity sensor arrangement by way of total internal reflection effected in the optical element.

The wording "a locally varying grating period" should express that the grating period has different values for different locations on the diffractive structure.

The invention is based on the concept, in particular, of realizing a determination of the exposure energy during the exposure of an element—such as e.g. a mask in a mask inspection apparatus—at a very small distance from or directly upstream of the relevant element by virtue of the fact that the electromagnetic radiation, at the relevant position situated in direct proximity to the element or the mask, is coupled out by diffraction at a diffractive structure and is directed to an intensity sensor arrangement by way of total internal reflection within an optical element functioning as an optical waveguide.

In other words, according to the invention, a diffractive structure introduced in the optical beam path directly upstream of the measurement object or the mask for the purpose of coupling out radiation is designed in the form of at least one diffraction grating in such a way that for at least one order of diffraction of the electromagnetic radiation diffracted at said diffractive structure (typically the ±1st order of diffraction), the critical angle of total internal reflection is exceeded upon impinging on a subsequent interface in the optical element provided according to the invention and serving as an optical waveguide. In this case, the invention is based on the consideration that for the relevant ±1st order of diffraction, the results obtained during this energy measurement are applicable, to a good approximation, to the zero order of diffraction actually relevant to the exposure of the measurement object or the mask.

In accordance with one embodiment, the optical system has an optical system axis, wherein the grating period decreases with increasing distance from said optical system axis.

In accordance with one embodiment, the diffractive structure is embodied on a light entrance surface of the optical element.

In accordance with one embodiment, the diffractive structure is embodied only on a partial region of said light entrance surface.

In accordance with one embodiment, the diffractive structure has a plurality of diffraction gratings which differ from one another with regard to the direction in which one and the same order of diffraction is directed by the relevant diffraction grating.

In accordance with one embodiment, the intensity sensor arrangement has a plurality of intensity sensors.

In accordance with one embodiment, the intensity sensor arrangement has at least one spatially resolving intensity sensor.

In accordance with one embodiment, the diffractive structure has at least one phase grating.

The invention furthermore relates to an optical system having a device having the features described above. In this case, the optical system can be, in particular, a mask inspection apparatus or a microlithographic projection exposure apparatus.

The values of the exposure energy determined according to the invention can be used, in a microlithographic projection exposure apparatus or in a mask inspection apparatus, respectively, to control the amount of light exposing the wafer or the mask, respectively. The exposure energy of the wafer can also be monitored by placing a diffractive structure according to the invention between one of the last lens elements of the projection lens and the wafer. This can be done in a feedback control loop for controlling the light source or for controlling attenuators in the beam path. The exposure energy of the wafer in the microlithographic projection exposure apparatus can also be monitored by placing a diffractive structure according to the invention between one of the last lens elements of the projection lens and the wafer. Furthermore, in the mask inspection apparatus the exposure energy determined according to the invention can also be used in computation of the resulting image of the mask inspection apparatus.

Further configurations of the invention can be gathered from the description and the dependent claims.

The invention is explained in greater detail below on the basis of exemplary embodiments that are illustrated in the accompanying figures.

BRIEF DESCRIPTION OF DRAWINGS

FIGS. 3A-3D, 4A-4C, 5, and 6 show schematic illustrations for elucidating further possible embodiments of the invention;

DETAILED DESCRIPTION

Figure 8:
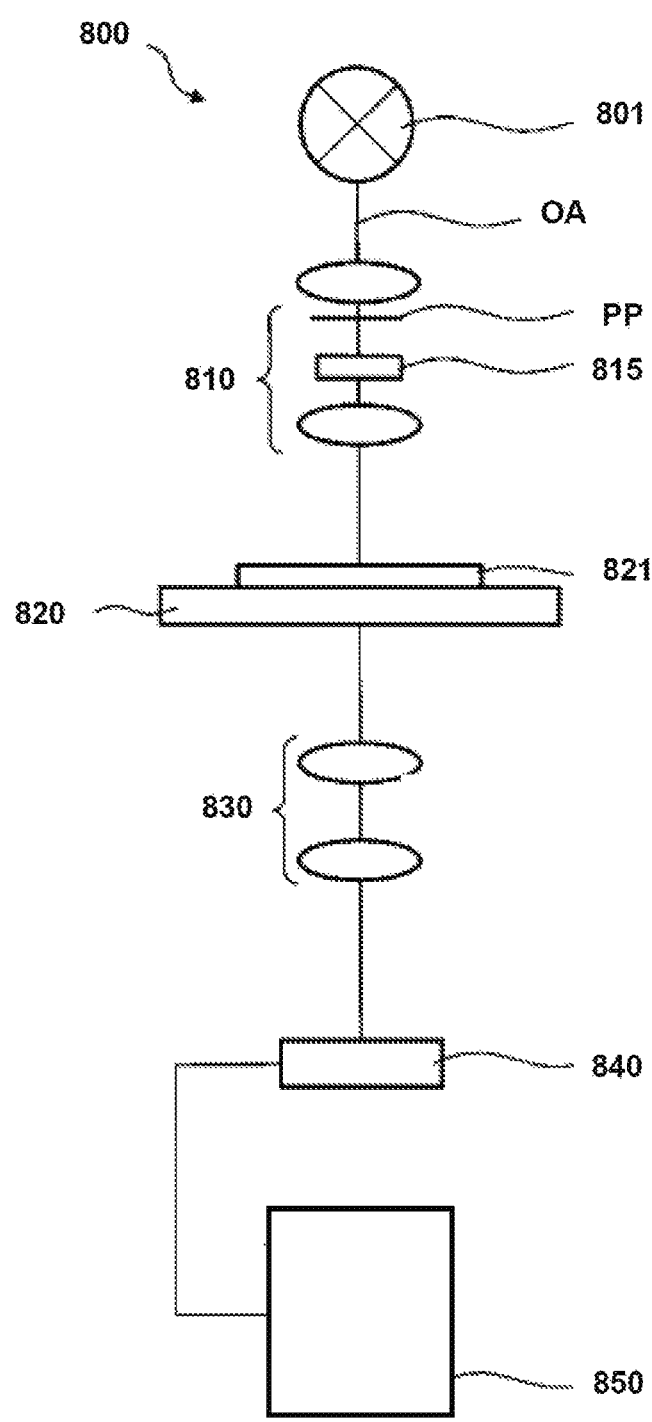
FIG. 8 shows a schematic illustration for elucidating one exemplary construction of a mask inspection apparatus.

FIG. 8 shows a possible construction of an example mask inspection apparatus 800 in which the present invention can be realized.

In accordance with FIG. 8, in the mask inspection apparatus 800, a mask 821 is mounted on a mask holder 820. The structures to be measured on the mask 821 are illuminated with illumination light generated by a light source 801 via an illumination optical unit 810. Light coming from the mask 821 is imaged by an imaging optical unit 830 onto a detector unit 840 and detected. The image data recorded by the detector unit 840 are evaluated in an evaluation unit 850 for determining the position of the structures.

The embodiments of a device for determining the exposure energy that are described below are usable, in particular, in a mask inspection apparatus having the construction shown in FIG. 8, for ascertaining the exposure energy of the electromagnetic radiation incident on the mask 821. In further applications, however, the device according to the invention is also advantageously usable in other microscopy applications and also in a microlithographic projection exposure apparatus (e.g., for determining the exposure energy of the electro-magnetic radiation incident on the wafer).

Figure 1:
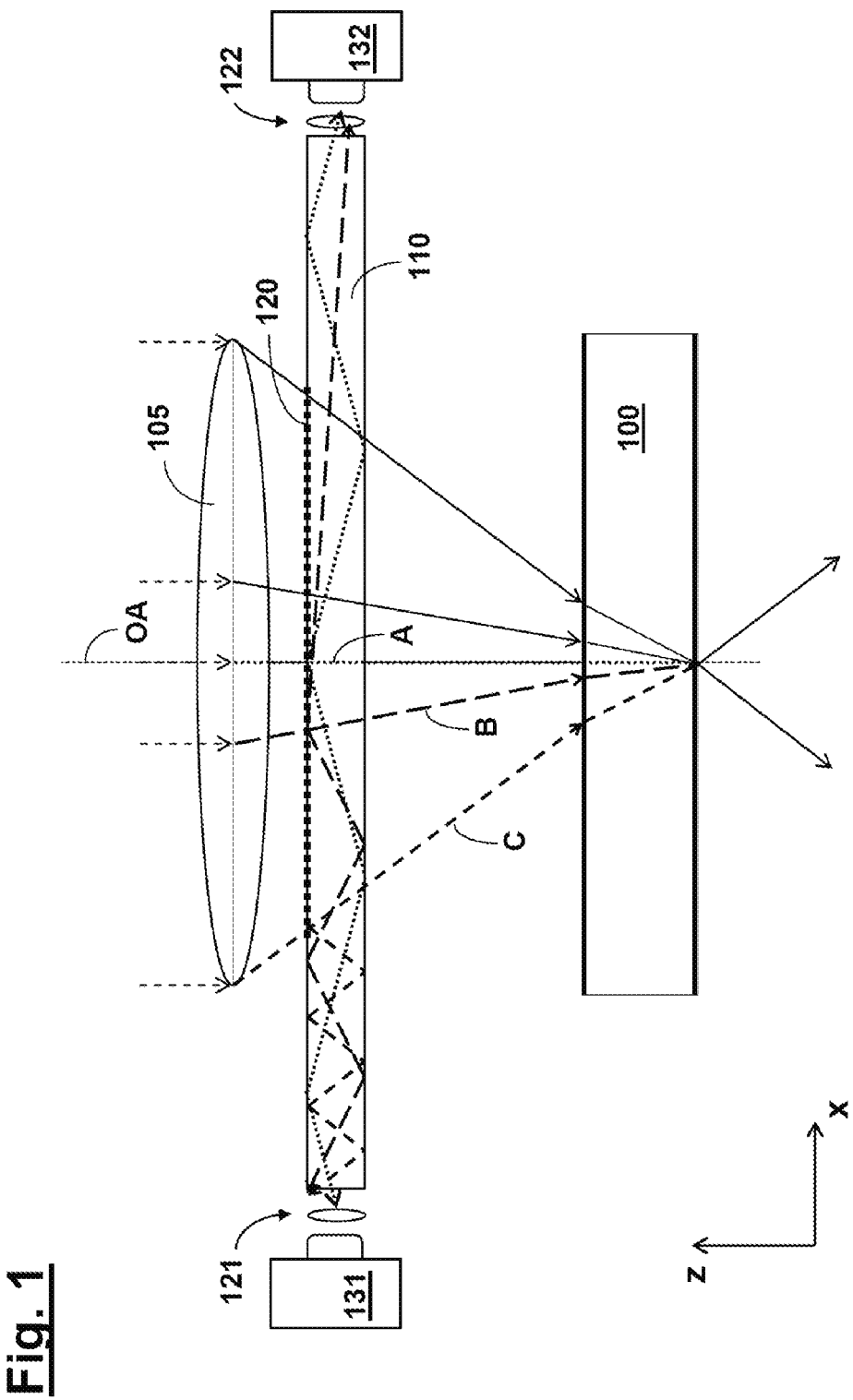
FIG. 1 shows a schematic illustration for elucidating the possible construction and the functional principle of a device for determining the exposure energy in one embodiment of the invention.

FIG. 1 shows a merely schematic illustration for elucidating the possible construction and the functional principle of a device for determining the exposure energy in one embodiment of the invention.

In accordance with FIG. 1, the device according to the invention in a mask inspection apparatus, e.g., having the construction described with reference to FIG. 8, between a last condenser lens element in the optical beam path, said condenser lens element being designated by "105", and a mask 100 whose exposure energy is intended to be determined, has a diffractive structure 120, which, in the exemplary embodiment, is embodied on the light entrance surface of an optical element 110 functioning as an optical waveguide. In the exemplary embodiment, the optical element 110 is realized as a quartz glass ($SiO_2$) plate. Furthermore, the device according to the invention has an intensity sensor arrangement, which, in the exemplary embodiment, comprises two intensity sensors 131, 132 and onto which the electromagnetic radiation coupled out as described below is directed via lens elements 121 and 122, respectively. By way of example, commercially available photodiode arrays are suitable as intensity sensors 131, 132, wherein a spatially resolved intensity measurement is also possible. Furthermore, in further embodiments, it is also possible to use just one intensity sensor, or it is also possible to use more than two intensity sensors, as described in even greater detail below.

In order to illustrate the functional principle, FIG. 1 schematically depicts, for three exemplary beams "A", "B", and "C" incident on the optical element 110 or the diffractive structure 120, the beam course after diffraction at the diffractive structure 120 both for the zero order of diffraction and for the ±1st order of diffraction. In this case, the diffractive structure 120 is configured such that—as indicated in FIG. 1—after diffraction at the diffractive structure 120 at least for one order of diffraction the critical angle of total internal reflection is exceeded within the optical element 110 with the consequence that the correspondingly diffracted electromagnetic radiation is transported within the optical element 110, which acts as an optical waveguide, by total internal reflection to the intensity sensor 131 and 132 respectively arranged laterally.

In the exemplary embodiment in FIG. 1, the above condition of total internal reflection is satisfied in each case for the ±1st order of diffraction for the beams "A" and "B" and at any rate still for the −1st order of diffraction for the beam "C".

A preferably narrowband light source (e.g., having a bandwidth of less than 1 nm) can be used for generating the electromagnetic radiation. However, the invention is not restricted thereto, wherein the use of a comparatively broadband light source can also be considered by appropriate adaptation of the diffractive structure.

Figure 5:
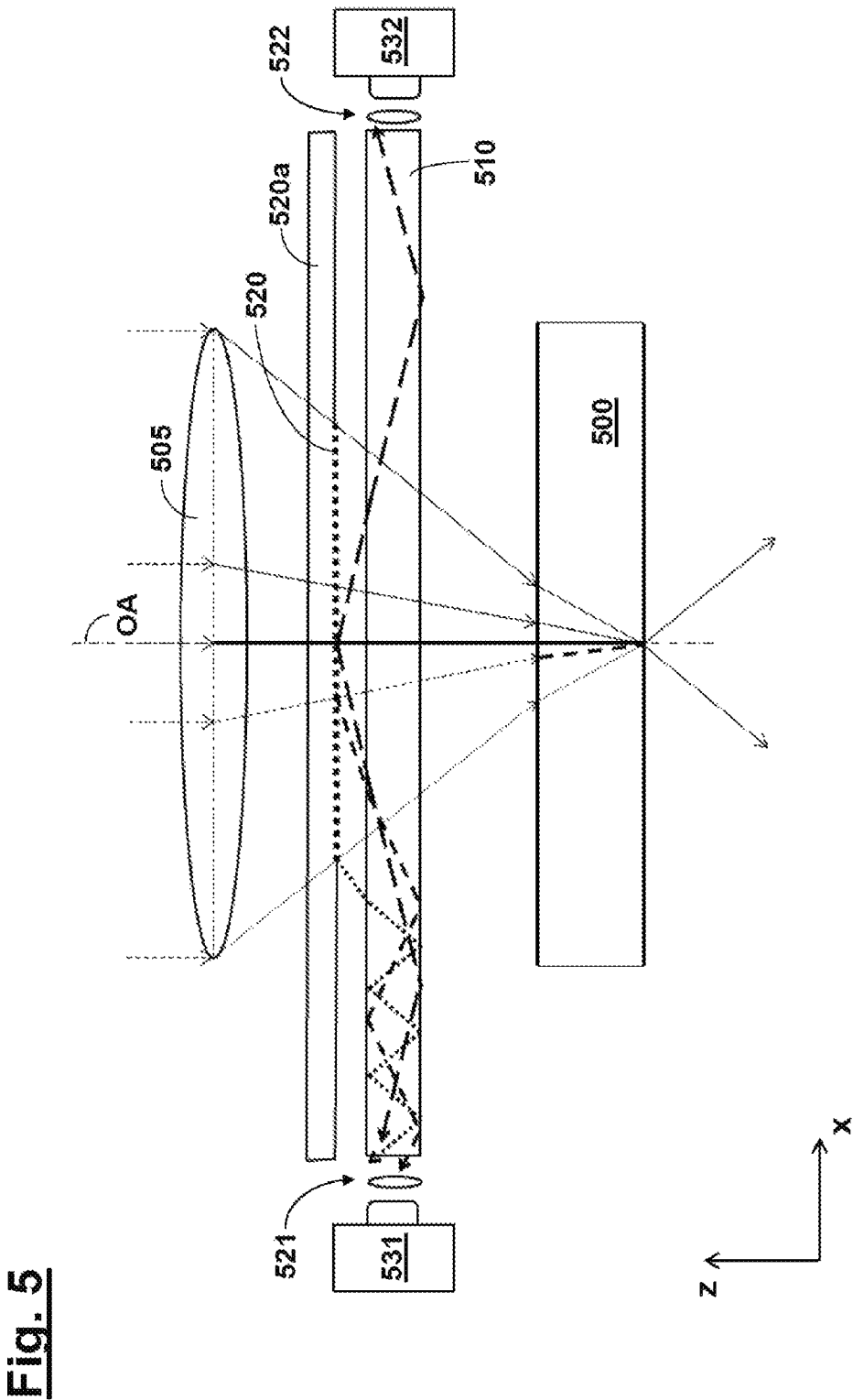

Even though, in the exemplary embodiment illustrated, the diffractive structure 120 is arranged directly on the light entrance surface of the optical element 110 functioning as an optical waveguide, the invention is not restricted thereto. Rather, in further embodiments, the diffractive structure 120 and the optical element 110 functioning as an optical waveguide can also be realized in mutually separate components spaced apart from one another. FIG. 5 shows a corresponding embodiment, wherein components that are analogous or substantially functionally identical in comparison with FIG. 1 are designated by reference numerals increased by "400". In this case, the separate component on which the diffractive structure 520 is embodied is designated by "520a". In the example of FIG. 5, the diffractive structure 520 is disposed on a light exit surface of the component 520a.

Furthermore, the optical element 110 functioning as an optical waveguide can also have a geometry deviating from the plane-parallel shape that is illustrated in the figure. In this case, in particular, by use of suitable inclination and/or curvature of the light entrance surface and/or of the light exit surface, it is also possible to achieve a suitable adaptation of the reflection angle occurring during the total internal reflection and also (e.g., by way of an increase in the number of reflections taking place) possibly desired light intermixing or homogenization.

Figure 6:
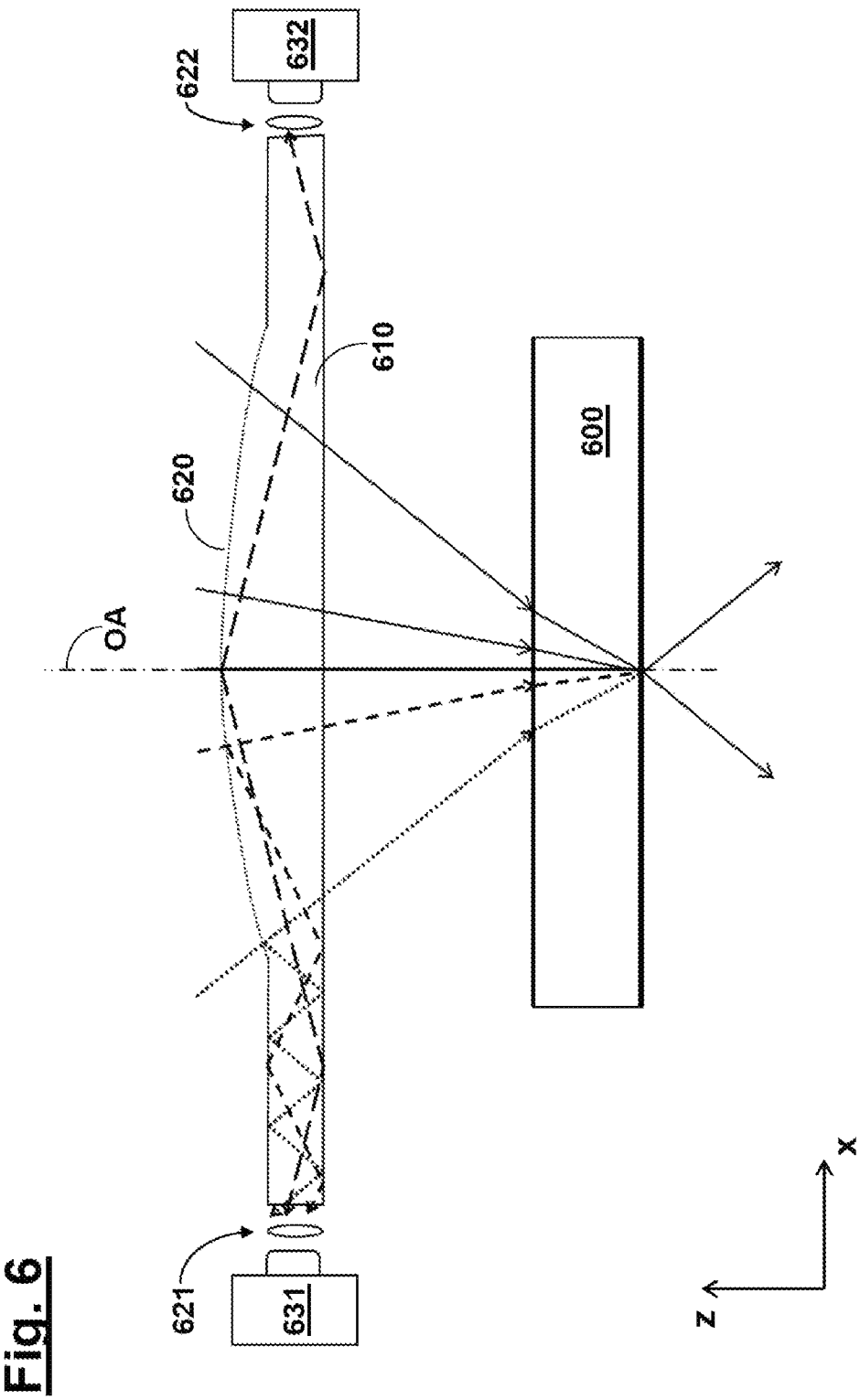
Figure 7:
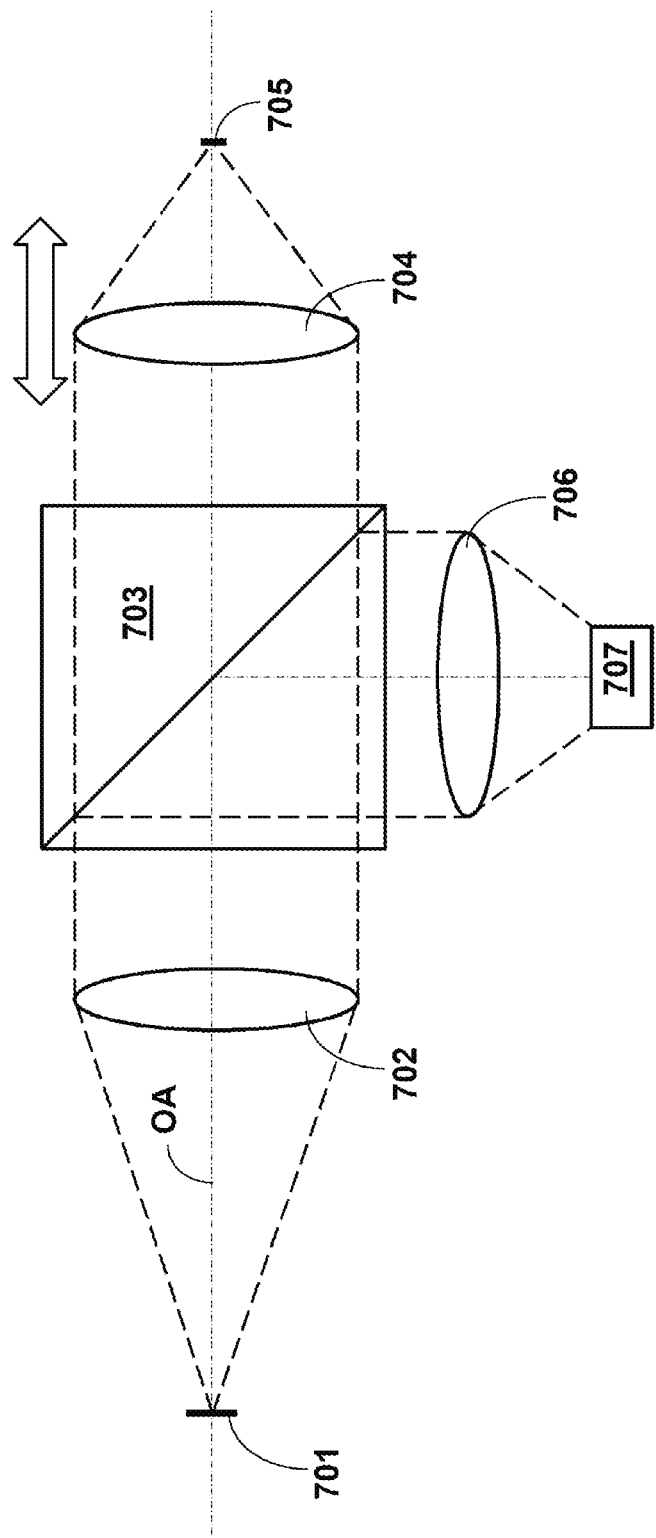
FIG. 7 shows a schematic illustration for elucidating a conventional approach for determining the exposure energy.

Furthermore, depending on the specific embodiment, an optical element present in the optical system anyway (e.g., the last condenser lens element in the optical beam path) can also be used for realizing the optical element according to the invention, functioning as an optical waveguide. For this purpose, in one merely exemplary embodiment, the last condenser lens element in the optical beam path can be embodied as a planoconvex lens element having a diffractive structure situated on the convexly curved light entrance surface, wherein the total internal reflection takes place in each case at the plane light exit surface of said planoconvex lens element. FIG. 6 shows a corresponding embodiment, wherein components that are analogous or substantially functionally identical in comparison with FIG. 1 are designated by reference numerals increased by "500".

In the exemplary embodiment in FIG. 1, the diffractive structure 120 on the light entrance surface of the optical element 110 is locally delimited insofar as above a predefined value of the radius (corresponding to the distance of the relevant position on the diffractive structure 120 from the optical system axis OA or in the x-y plane) there is no longer a diffractive structure present on the optical element 110. Such a configuration has the advantage that it is possible to prevent any undesired diffraction-dictated beam exit of the beams subjected to total internal reflection via the light entrance surface of the optical element 110. However, the invention is not restricted thereto, and so in further embodiments it is also possible for the light entrance surface of the optical element 110 to be covered by the diffractive structure 120 over the whole area, wherein in this case it is possible to prevent an undesired diffraction-dictated beam exit via the light entrance surface of the optical element 110 by suitable adaptation of the grating period of the diffractive structure 120.

The diffractive structure 120 is adapted to the specific conditions of the device according to the invention including the intensity sensor arrangement in a targeted manner preferably both with regard to the grating period ("pitch") and with regard to the respective linewidth ("CD"). In this case, by way of said structure width in the diffractive structure 120, it is possible to control the intensity in the ±1st order of diffraction and thus the electrical energy respectively coupled out in the direction of the intensity sensors 131, 132. As optimum modulation of the intensity sensors 131, 132 as possible can thereby be achieved as a result, by virtue of the fact that, on the one hand, the radiation intensity directed to the intensity sensors 131, 132 is high enough for a low-noise measurement, but on the other hand overdriving of the intensity sensors 131, 132 is also avoided (wherein for avoiding the overdriving of the intensity sensors 131, 132, if necessary, suitable elements for intensity attenuation can also be used).

Furthermore, the angle at which the respective diffracted beams are incident on the light exit surface of the optical element 110 functioning as an optical waveguide can be set by way of a suitable choice of the grating period ("pitch") of the diffractive structure 120. In this case, in particular, a local variation of the grating period can also be realized. In particular, for adapting the angle of incidence on the light exit surface of the optical element 110 functioning as an optical waveguide depending on whether the beam of the respective zero order of diffraction is incident on said optical element 110 with normal incidence or already obliquely, a local variation of the grating period of the diffractive structure can be realized in such a way that said grating period decreases with increasing distance from the optical system axis OA.

Figure 2:
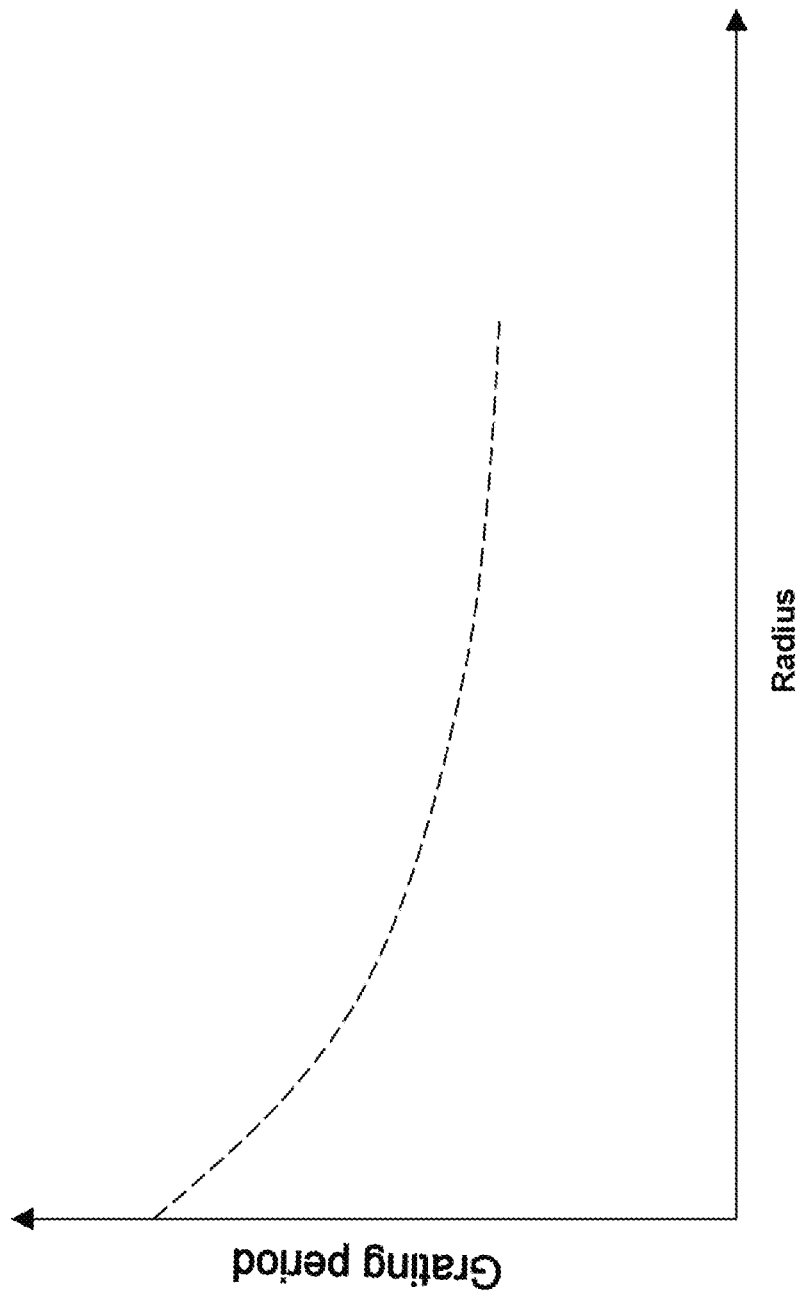
FIG. 2 shows a diagram of a possible variation of the grating period in a grating structure present in the device according to the invention.

One exemplary possible profile is illustrated in FIG. 2. A graph 200 shows a curve 202 that represents an example relationship between the grating period of the diffractive structure 120 and the radius. In this example, the grating period is largest when the radius is zero (i.e., at the optical axis OA), and the grating period decreases as the radius increases. In further embodiments, some other local profile (e.g., a linear profile, which means that the curve 202 is replaced with a straight line) of the grating period of the diffractive structure 120 can also be chosen depending on the specific conditions.

Figure 3A:
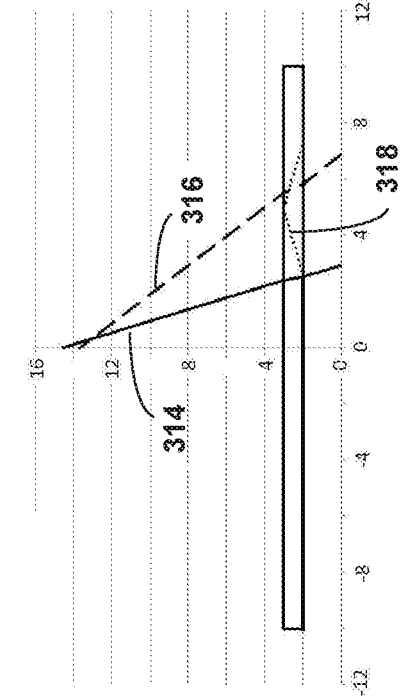
Figure 3C:
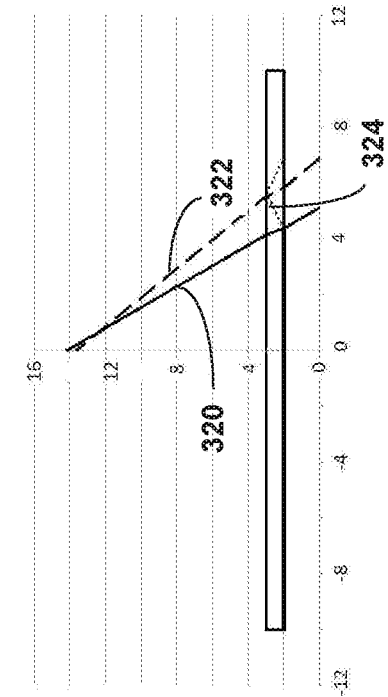
Figure 3B:
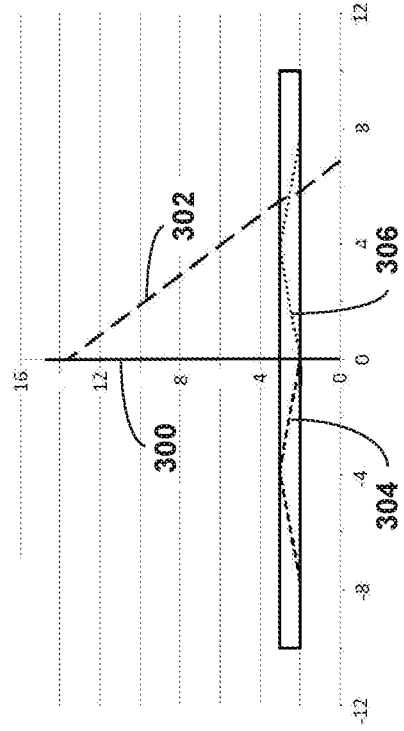
Figure 3D:
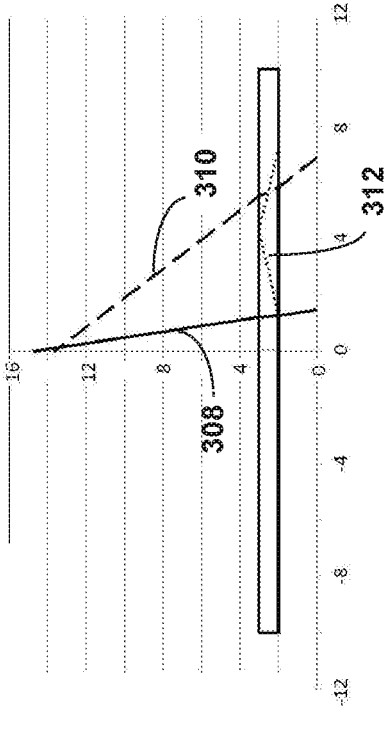

One merely exemplary, possible realization of the adaptation of the grating period depending on the angle of incidence is illustrated in the diagrams in FIGS. 3A to 3D, wherein four exemplary values for the grating period for a given radius are shown. In FIGS. 3A to 3D the light enters into the optical element from below. For a specific angle of incidence, the optical element or its diffractive structure is hit on a specific radius which is given by the position of the optical element and the angle of incidence. For this specific radius and a specific wavelength, the grating period is adapted or optimized with regard to total internal reflection. FIGS. 3A to 3D correspond to a single embodiment in which the grating period is different at different radiuses, i.e., grating period=128 nm at radius=0 (FIG. 3A), grating period=118 nm at radius r1 (FIG. 3B), and grating period=110 nm at radius r2 and r3 (FIGS. 3C and 3D). These examples (grating period of 128 nm, 118 nm, 110 nm) apply only to incident light having a specific wavelength, or a specific range of wavelengths where total internal reflection occurs. The wavelength of the incident light can be, e.g., approximately 193 nm. If the wavelength of the incident light changes, the grating periods should change accordingly. In this case, within the optical element functioning as an optical waveguide and illustrated once again as a plane plate in each case, total internal reflection is achieved for the ±1st order of diffraction in accordance with FIG. 3A (with normal light entrance of the beam considered with regard to its diffraction) and still for the −1st order of diffraction in accordance with FIGS. 3B-3D (with increasingly oblique light entrance). For FIGS. 3B-3D, there is no total internal reflection for the +1$^{st}$ order of diffraction.

In FIG. 3A, a solid line 300 represents the 0st order of diffraction of a beam with a specific angle of incidence, a dashed line 302 represents the 0st order of a marginal or peripheral beam, dashed line 304 represents the +1st diffraction, and dashed line 306 represents the −1st diffraction order. In FIG. 3B, a solid line 308 represents the 0st order of diffraction of a beam with a specific angle of incidence, a dashed line 310 represents the 0st order of a marginal or peripheral beam, and dashed line 312 represents the −1st diffraction order. In FIG. 3C, a solid line 314 represents a beam with a specific angle of incidence, a dashed line 316 represents the 0st order of a marginal or peripheral beam, and dashed line 318 represents the −1st diffraction order. In FIG. 3D, a solid line 320 represents a beam with a specific angle of incidence, a dashed line 322 represents the 0st order of a marginal or peripheral beam, and dashed line 324 represents the −1st diffraction order. The marginal or peripheral beam denoted with "302", "310", "316" or "322", respectively, also represents the end of the curve "202" in FIG. 2, which means that the diffractive structure ends at the respective position of the optical element.

In further embodiments, a spatially resolved determination of the exposure energy can also be realized by virtue of the fact that the diffractive structure 120 according to the invention is composed of a plurality of diffraction gratings that diffract the incident electromagnetic radiation in mutually different directions. Examples thereof are shown merely schematically in FIGS. 4A to 4C.

Figure 4A:
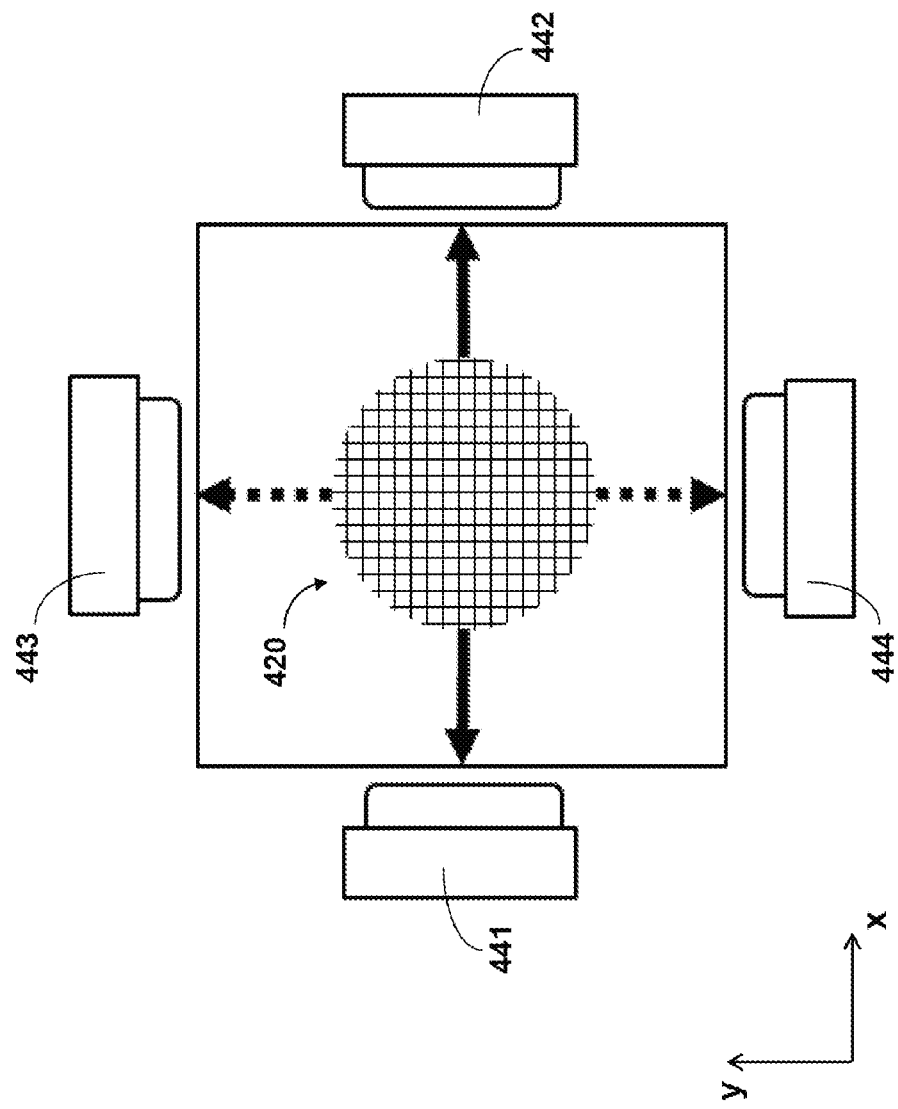

In this case, in accordance with FIG. 4A, it is possible to use a checkered grating structure 420 as a superimposition of two line gratings extending in the x-direction and y-direction, respectively, and having in each case two assigned intensity sensors 441, 442 and 443, 444, respectively. Furthermore, in accordance with FIG. 4B and FIG. 4C, a grating structure 450 and 460, respectively, can also have a plurality of line gratings 451 to 455 and 461 to 468, respectively, which are assigned to different regions of the cross section of the light bundle in each case and which diffract the electromagnetic radiation in mutually different directions or towards different intensity sensors (not depicted), in order thus to realize a spatially resolved determination of the exposure energy.

In the example of FIG. 4B, the line gratings have diffraction gratings that diffract the incident electromagnetic radiation at or near the center of the light bundle substantially in the +x 456, −x 457, +y 458, and −y 459 directions. The line grating 452 diffracts the incident electromagnetic radiation at or near the upper left edge of the cross section of the light bundle substantially in the direction 470 (approximately 135° relative to the +x direction). The line grating 453 diffracts the incident electromagnetic radiation at or near the upper right edge of the cross section of the light bundle substantially in the direction 472 (approximately 45° relative to the +x direction). The line grating 454 diffracts the incident electromagnetic radiation at or near the lower left edge of the cross section of the light bundle substantially in the direction 474 (approximately 225° relative to the +x direction). The line grating 455 diffracts the incident electromagnetic radiation at or near the lower right edge of the cross section of the light bundle substantially in the direction 476 (approximately 315° relative to the +x direction). The terms "upper," "lower," "left," and "right" refer to the directions shown in the figure. It is understood that the grating structures (e.g., 450 and 460) can be oriented differently from those shown in the figures.

Figure 4C:
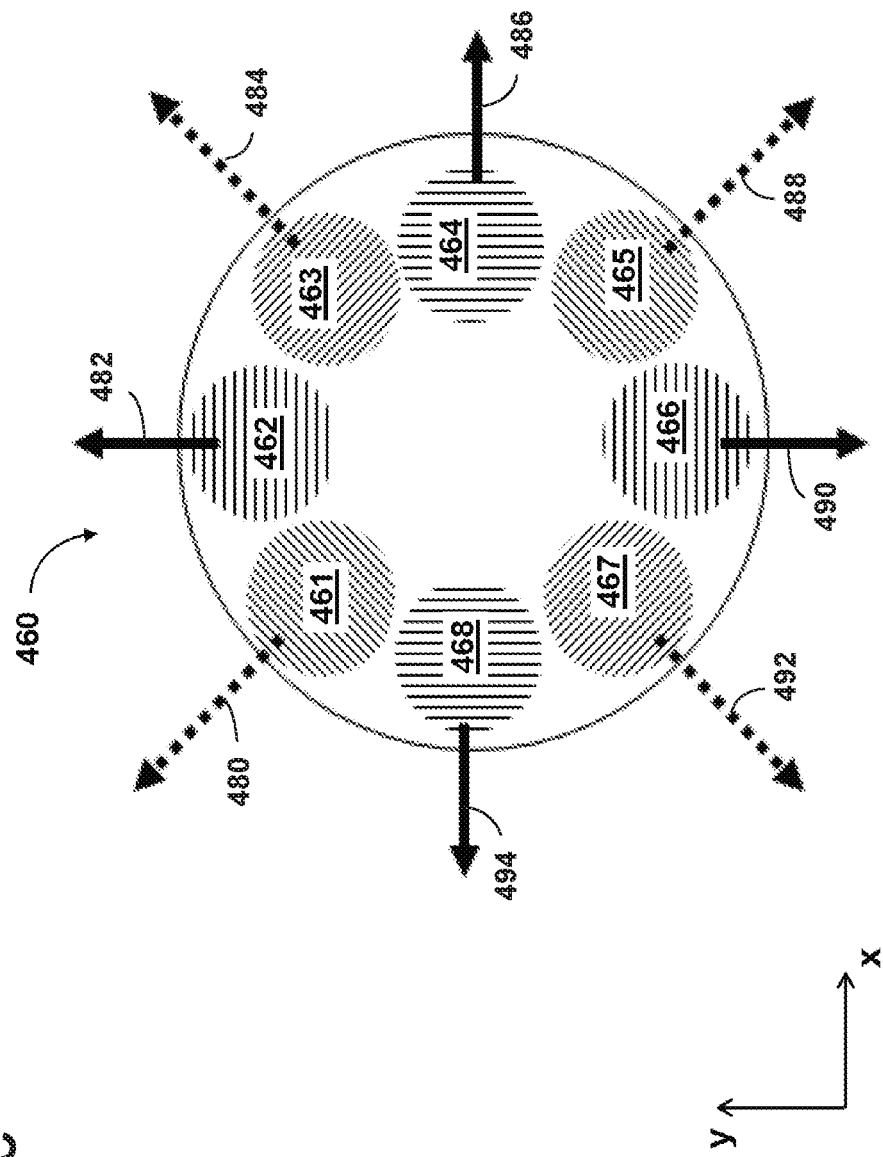

In the example of FIG. 4C, the line grating 461 diffracts the incident electromagnetic radiation at or near the upper left edge of the pupil substantially in the direction 480 (approximately 135° relative to the +x direction). The line grating 462 diffracts the incident electromagnetic radiation at or near the upper edge of the pupil substantially in the direction 482 (approximately in the +y direction). The line grating 463 diffracts the incident electromagnetic radiation at or near the upper right edge of the pupil substantially in the direction 484 (approximately 45° relative to the +x direction). The line grating 464 diffracts the incident electromagnetic radiation at or near the right edge of the pupil substantially in the direction 486 (approximately in the +x direction). The line grating 465 diffracts the incident electromagnetic radiation at or near the lower right edge of the pupil substantially in the direction 488 (approximately 315° relative to the +x direction). The line grating 466 diffracts the incident electromagnetic radiation at or near the lower edge of the pupil substantially in the direction 490 (approximately in the −y direction). The line grating 467 diffracts the incident electromagnetic radiation at or near the lower left edge of the pupil substantially in the direction 492 (approximately 225° relative to the +x direction). The line grating 468 diffracts the incident electromagnetic radiation at or near the left edge of the pupil substantially in the direction 494 (approximately in the −x direction).

In embodiments of the invention, a calibration step can be performed by determining the intensity measured by the intensity sensor arrangement for different values of the intensity of the illumination light which enters the device or which is generated by the light source (e.g., the light source 801 in FIG. 8). In such a calibration, the intensity measured by the intensity sensor arrangement can also be determined for different local distributions of the intensity of the illumination light (i.e., different illumination settings), thereby considering that said intensity of the illumination light may also vary locally.

In some implementations, the evaluation unit 850 can include one or more data processors for processing data, one or more storage devices for storing data, such as one or more databases, and/or one or more computer programs including instructions that when executed by the evaluation unit causes the evaluation unit to carry out the processes. The evaluation unit can include one or more input devices, such as a keyboard, a mouse, a touchpad, and/or a voice command input module, and one or more output devices, such as a display, and/or an audio speaker. The evaluation unit can show graphical user interfaces on the display to assist the user of the mask inspection apparatus.

In some implementations, the evaluation unit can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the evaluation unit is configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for operating a mask inspection apparatus described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments.

Even though the invention has been described on the basis of specific embodiments, numerous variations and alternative embodiments are apparent to a person skilled in the art, for example by combination and/or exchange of features of individual embodiments.

Accordingly, it goes without saying for a person skilled in the art that such variations and alternative embodiments are concomitantly encompassed by the present invention, and the scope of the invention is restricted only within the meaning of the accompanying patent claims and the equivalents thereof.

What is claimed is:

1. A system comprising:
   a light source;
   an illumination optical unit configured to project light from the light source towards a first element;
   a first detector unit;
   an imaging optical unit configured to project light from the first element towards the first detector unit;
   an exposure determining device disposed between the illumination optical unit and the first element, the exposure determining device comprising:
      a first optical element;
      a diffractive structure; and
      a second detector unit;
      wherein the exposure determining device is configured such that light diffracted at the diffractive structure during operation of the system, in at least one order of diffraction, is directed to the second detector unit by total internal reflection in the first optical element.

2. The system of claim 1 in which the first element comprises a photomask, the system comprises a mask inspection system, and the exposure determining device is configured to estimate an exposure energy applied to the photomask during inspection of the photomask.

3. The system of claim 1, wherein the diffractive structure has a locally varying grating period; and
   the second detector unit comprises an intensity sensor arrangement;
   wherein electromagnetic radiation diffracted at the diffractive structure during operation of the system, in at least one order of diffraction, is directed to the intensity sensor arrangement by way of total internal reflection effected in the first optical element.

4. The system according to claim 3, wherein the system has an optical system axis (OA), and the grating period decreases with increasing distance from said optical system axis (OA).

5. The system according to claim 3, wherein the diffractive structure is embodied on a light entrance surface of the first optical element.

6. The system according to claim 5, wherein the diffractive structure is embodied only on a partial region of said light entrance surface.

7. The system according to claim 3, wherein the diffractive structure has a plurality of diffraction gratings which differ from one another with regard to the direction in which one and the same order of diffraction is directed by the relevant diffraction grating.

8. The system according to claim 3, wherein the intensity sensor arrangement has a plurality of intensity sensors.

9. The system according to claim 3, wherein the intensity sensor arrangement has at least one spatially resolving intensity sensor.

10. The system according to claim 3, wherein the diffractive structure has at least one phase grating.

11. The system according to claim 1, wherein the system comprises a mask inspection apparatus.

12. The system according to claim 1, wherein the system comprises a microlithographic projection exposure apparatus.

13. The system of claim 12 in which the microlithographic projection exposure apparatus is configured to expose the mask to project a pattern on the mask onto a second element to form the pattern on the second element, and the exposure determining device is configured to estimate the exposure energy applied to the mask during the exposure of the mask.

14. The system of claim 3 in which the diffractive structure is disposed on the first optical element.

15. The system of claim 3 in which the diffractive structure is disposed on a second optical element that is positioned upstream of the first optical element in a path of electromagnetic radiation used to expose the first element.

16. The system of claim 15 in which the diffractive structure is disposed on a radiation exit surface of the second optical element.

17. The system of claim 3 in which the system is configured to expose the first element using electromagnetic radiation, and the diffractive structure is configured to diffract a first portion of the electromagnetic radiation toward the intensity sensor arrangement and allow a second portion of the electromagnetic radiation to pass the diffractive structure and travel toward the first element to expose the first element.

18. The system of claim 1, in which the system is configured to perform:
  projecting electromagnetic radiation along a propagation path toward the first element;
  disposing the first optical element and the diffractive structure upstream of the first element in the propagation path, wherein the diffractive structure has a locally varying grating period; and
  estimating an exposure energy applied to the first element due to the electromagnetic radiation, including:
    diffracting a fraction of the electromagnetic radiation in at least one order of diffraction, and
    directing the diffracted electromagnetic radiation to the second detector unit by total internal reflection effected in the optical element, wherein the second detector unit comprises an intensity sensor arrangement.

19. The system of claim 18, wherein the system is configured to perform directing multiple portions of diffracted electromagnetic radiation that are associated with a same order of diffraction toward multiple directions.

20. The system of claim 18, wherein the system is configured to perform:
  projecting a portion of the electromagnetic radiation that has not been diffracted toward the first element;
  exposing the first element using the electromagnetic radiation; and
  performing at least one of (i) collecting data representing the exposed first element, and inspecting the first element based on the collected data; or (ii) projecting a pattern on the first element onto a second element, and forming the pattern on the second element.

21. The system of claim 18 in which the first element comprises a photolithography mask.

* * * * *